United States Patent [19]

Schober et al.

[11] Patent Number: 5,472,824
[45] Date of Patent: * Dec. 5, 1995

[54] FLEXOGRAPHIC PRINTING RELIEFS HAVING INCREASED FLEXIBILITY

[75] Inventors: Manfred Schober, Offenbach; Hans L. Schroder, Reinheim, both of Germany

[73] Assignee: E. I. Du Pont de Nemours and Company, Wilmington, Del.

[*] Notice: The portion of the term of this patent subsequent to Jan. 16, 2007, has been disclaimed.

[21] Appl. No.: 274,464

[22] Filed: Nov. 21, 1988

[30] Foreign Application Priority Data

Dec. 24, 1987 [DE] Germany ................. 37 44 243.0

[51] Int. Cl.⁶ ................. G03F 7/18; G03F 7/16
[52] U.S. Cl. ................. 430/309; 430/306; 156/275.5; 156/364.2; 522/171
[58] Field of Search ................. 430/286, 287, 430/281, 907, 288, 306, 300, 302, 325, 309; 101/415.1; 522/121; 156/275.5, 304.2, 304.1

[56] References Cited

U.S. PATENT DOCUMENTS

| 4,045,231 | 8/1977 | Toda et al. | 430/286 |
| 4,162,919 | 7/1979 | Richter et al. | 438/907 |
| 4,264,705 | 4/1981 | Allen et al. | |
| 4,320,188 | 3/1982 | Heinz et al. | |
| 4,323,636 | 4/1982 | Chen. | |
| 4,323,637 | 4/1982 | Chen et al. | 430/271 |
| 4,357,413 | 11/1982 | Cohen et al. | 430/253 |
| 4,400,460 | 8/1983 | Fickes et al. | 430/306 |
| 4,517,278 | 5/1985 | Sakurai | 430/286 |

FOREIGN PATENT DOCUMENTS

| 263301 | 4/1988 | European Pat. Off. |
| 266069 | 5/1988 | European Pat. Off. |

OTHER PUBLICATIONS

Shell booklet (1983) re Kraton® thermoplastic rubber.
Handbook of Adhesives, 2d ed., pp. 304–307 (1977).

*Primary Examiner*—Christopher D. Rodee

[57] ABSTRACT

Photosensitive composition comprising, inter alia, thermoplastic-elastomer block copolymer binders and addition-polymerizable monomer having terminal ethylenically unsaturated end groups wherein at least one monomer has one acrylate or methacrylate group, said monomer forms a homopolymer having a solubility parameter in the range between 7.6 and 9.6 and a glass transition temperature below 0° C. and, further wherein, at least one monomer has more than one acrylate or methacrylate groups, said monomer forms a homopolymer having a solubility parameter in the range between 9.6 and 12.

2 Claims, No Drawings

FLEXOGRAPHIC PRINTING RELIEFS HAVING INCREASED FLEXIBILITY

FIELD OF THE INVENTION

This invention relates to a photosensitive composition for making flexographic printing reliefs and, more particularly, to a photosensitive composition for making a flexographic printing relief having improved flexibility.

BACKGROUND OF THE INVENTION

The production of photopolymer reliefs for flexographic printing typically involves imagewise exposing the photosensitive layer of an element with ultraviolet radiation. Unexposed areas are washed off using a suitable solvent. Solvent is removed by evaporation and, if necessary, the surface is treated to remove tack. Examples of this are found in the following Patents and Preliminary Published Applications: U.S. Pat. Nos. 2,948,611, 3,024,180, 3,798,035, 3,951,657, DE 2,138,582, DE 2,215,090, DE 2,223,808 and DE 2,364,873.

Photosensitive compositions used to make these reliefs usually comprise 1) an addition polymerizable, nongaseous ethylenically unsaturated monomer, 2) a photoinitiator or photoinitiating system activated by actinic radiation and 3) a thermoplastic, elastomeric polymeric binder. Generally the binder is a triblock copolymer having an elastomeric block sandwiched between two thermoplastic blocks, e.g., polystyrene-polybutadiene-polystyrene (S-B-S) or polystyrene-polyisoprene-polystyrene (S-I-S). Such block copolymers are preferred over other polymer binders. They are commercially available, cost-effective, are extrudable, show good solvent resistance and are resistant to cold flow. Examples of flexographic printing reliefs containing these block copolymer binders are described in German Patent 2,215,090, German Preliminary Published Application 2,223,808, German Patent 2,815,678 and German Patent 2,610,206.

However, printing reliefs containing block copolymer binders are not always suitable for use in flexographic printing. Such reliefs have decreased flexibility and elasticity which impairs their ability to contact substrates having irregular substrates. Consequently, inferior printed materials are produced. In addition, such printing reliefs become detached from the cylinder on which they are mounted. This is undesirable because it involves a shutdown of machines and production. The inability of the printing relief to remain affixed to the printing cylinder is caused by the insufficient flexibility or rigidity of the printing relief.

The problem arises most frequently with long printing runs and the problem becomes especially acute with printing reliefs affixed to cylinders having small radii. It has been observed that detachment of printing reliefs is promoted by penetration of printing ink solvents into the gap created between the edges of the printing reliefs wound around the printing cylinder.

Use of elastomeric block copolymers as binders in photopolymerizable printing reliefs has been suggested as a way to improve flexibility and elasticity of printing reliefs. This is described in U.S. Pat. No. 4,320,188 and U.S. Pat. No. 4,430,417. Use of polybutadiene as the sole binder is described in European Patent 76,588 and U.S. Pat. No. 4,517,278.

Unfortunately, these alternatives create a new set of problems. Elastomeric binders alone are not suitable to formulate a photosensitive composition to make flexographic printing reliefs because such materials are extremely difficult to extrude due to the high melt viscosity of the elastomer block copolymer. Printing reliefs having polybutadiene as the sole binder exhibit poor wash-off quality due to the poor solubility of polybutadiene in the customary development solutions. Furthermore, these printing elements have cold flow problems which leads to poor storage stability. The surface of the resulting printing relief becomes so weak that it is not suitable for flexographic printing.

Multilayer elements have been tried to improve flexibility and elasticity by using elastic interlayers or underlayers. Such plates are described in U.S. Pat. Nos. 4,162,919, 4,264,705, 4,248,960, 4,266,007.

The disadvantage in using multilayer elements is that a more elaborate manufacturing process is required. This increases the production cost as well as the capacity for error In many instances adhesives or special adhesive layers are required between different layers. Detachment of individual layers from one another can occur and there is no guarantee that the planarity of the printing surface will be maintained.

SUMMARY OF THE INVENTION

This invention relates to photopolymerizable composition for making flexographic photosensitive elements comprising:

a) at least one thermoplastic-elastomer block copolymeric binder;

b) at least two addition-polymerizable monomers having terminal ethylenically unsaturated groups wherein
  (i) at least one of the addition-polymerizable monomers has one acrylate or methacrylate group, said monomer forms a homopolymer having a solubility parameter in the range between 7.6 and 9.6 and a glass transition temperature below 0° C.;
  (ii) at least one of the addition-polymerizable monomers has more than one acrylate or methacrylate group, said monomer forms a homopolymer having a solubility parameter in the range between 9.6 and 12; and
  (iii) the ratio of (i) to (ii) is in the range from 10:1 to 2:1; and c) a photoinitiator or photoinitiating system.

In another embodiment the invention relates to use of this composition to make flexographic printing reliefs, and use of the composition to seal edges and/or fill gaps in flexographic printing elements or reliefs.

DETAILED DESCRIPTION OF THE INVENTION

The object of the present invention was to make photopolymerizable imaging materials with photosensitive compositions using thermoplastic-elastomer block copolymers to produce printing reliefs having improved flexibility and low resiliency. During printing, good adhesion of printing reliefs on printing cylinders, especially on cylinders having small circumferences, should be achieved. Other properties of the photopolymerizable imaging materials should not be adversely affected. In particular, a reduction in photospeed should be avoided. The hardness of the printing reliefs should not be substantially reduced. These reliefs should have a Shore A hardness in the range from 35 to 55.

Surprisingly and unexpectedly, it was found that the object could be achieved by using a photosensitive composition comprising at least one thermoplastic-elastomer block copolymer as a binder, at least two addition-polymerizable compounds whose end groups are ethylenically unsaturated, and a photoinitiator or photoinitiating system.

Monomer mixtures containing addition-polymerizable compounds having one ethylenically unsaturated group and those having several ethylenically unsaturated groups are mentioned in U.S. Pat. Nos. 4,517,278, 4,162,919, 4,266,007, and German Preliminary Published Application 2,720,560. These references describe using monomer mixtures with different binders or in different mixing ratios. German Preliminary Published Application 2,720,560, mentions that the content of monomers having one ethylenically unsaturated group should not exceed 50% of total monomer concentration and should be below 30%. As is discussed below, the photopolymerizable composition of the invention contains monomers having one ethylenically unsaturated group in a two- to ten-fold excess compared with monomers having several ethylenically unsaturated groups.

One of the essential components of the photopolymerizable composition of the invention is a thermoplastic-elastomer block copolymer. The preferred block copolymers are linear and radial block copolymers having polystyrene end blocks which can also be oil extended linear polystyrene-polybutadiene-polystyrene block copolymer, linear polystyrene-polyisoprene-polystyrene, linear oil-extended polystyrene-polybutadiene-polystyrene block copolymer, linear oil-extended polystyrene-polyisoprene-polystyrene block copolymer, radial (polystyrene-polybutadiene)4Si block copolymer, radial (polystyrene-polyisoprene)4Si block copolymer, radial oil extended (polystyrene-polybutadiene)4Si block copolymer, and radial oil extended (polystyrene-polyisoprene)4Si block copolymer.

Polystyrene-polybutadiene-polystyrene or polystyrene-polyisoprene-polystyrene linear block copolymers are particularly well suited for use as binders. The average molecular weight of the block copolymers should be between 80,000 and 300,000, and, preferably, between 100,000 and 250,000. It is also desirable that the percentage of polystyrene constitute 10%–40% of the block copolymer based on the weight of the copolymer and, more preferably, 15–30%.

Addition-polymerizable compounds suitable for practicing the invention exhibit a selective block/monomer compatibility. Thus, monomers must be present in the photosensitive composition which are compatible with both the elastomeric and the thermoplastic block of the thermoplastic-elastomer block copolymer binder and monomers must be present which are compatible only with the thermoplastic block of the block copolymer.

Hildebrand's solubility parameter is used as the criterion to select the appropriate monomers. This criterion is discussed in the Polymer Handbook, 2nd ed., 1975, p. IV-337. There can be mentioned as monomers which are compatible with both blocks of the thermoplastic-elastomer block copolymer monomers having one acrylate or methacrylate group whose homopolymers have solubility parameters in the range between 7.6 and 9.6. Unless indicated otherwise the units are $(cal/cm^3)^{1/2}$. These homopolymers have glass transition temperatures below 0° C. Esters of open chain, unsubstituted or substituted, aliphatic monoalcohols and/or monohydroxyethers having 2 to 15 carbon atoms in the main chain are preferred. Examples of monomers having one acrylate or methacrylate group include: butyl acrylate, octyl acrylate, isodecyl acrylate, tetradecyl acrylate, isodecyl methacrylate, 2-hexyloxyethyl acrylate.

Addition-polymerizable compounds of the invention having a selective compatibility with the thermoplastic block of the binder are those monomers having several acrylate or methacrylate groups wherein these monomers form homopolymers having solubility parameters in the range between 9.6 and 12. Esters of aliphatic, unsubstituted or substituted, polyols and/or polyhydroxyethers having 2 to 12 carbon atoms in the main chain are preferred. Examples of monomers having more than one acrylate or methacrylate group include: 1,4-butanediol diacrylate, 1,6-hexanediol diacrylate, 1,6-hexanediol dimethacrylate, 1,12-dodecanediol dimethacrylate, trimethylol propane triacrylate, and dipentaerythritol monohydroxy-pentaacrylate.

The properties of the resulting photopolymerizable composition can be varied by adjusting the ratio of monomers having one acrylate or methacrylate group (M1) to monomers having several acrylate or methacrylate groups (M2). A suitable ratio of M1 to M2 for practicing the invention is in the range between 10:1 to 2:1, preferably, 8:1 to 3:1. For example, the following combinations can be used: mixtures of compounds having one acrylate group and compounds having several acrylate groups, mixtures of compounds having one methacrylate group and compounds having several methacrylate groups, mixtures of compounds having one acrylate group and compounds having several methacrylate groups, and mixtures of compounds having one methacrylate group and compounds having several acrylate groups. Adjusting the ratio of monomers results in a photopolymerizable composition which can be used to make a flexographic printing relief having increased flexibility without adversely affecting other properties such as photospeed and hardness.

In addition, the photopolymerizable composition of the invention contains a photoinitiator or photoinitiating system, such as, α-methylbenzoin, benzoin acetate, benzophenone, benzildimethylketal, ethyl-anthraquinone/ 4,4'-bis-(dimethylamino)benzo-phenone.

Other additives which can be used to formulate the photopolymerizable composition of the invention include fillers, dyes, antioxidants, antiozonants, and plasticizers. If a plasticizer is used, it can be present in an amount between 0% and 30% by weight based on the weight of the photopolymerizable composition. The preferred average molecular weight of the plasticizer is between 1,000 and 10,000 and it preferably consists of polybutadiene, polystyrene, or a combination thereof.

The photosensitive composition of the invention usually contains 60%–94.5% of block copolymer, 5%–30% of monomer mixture and 0.5%–5% of initiator. Percentages are by weight based on the total weight of the photopolymerizable composition unless otherwise indicated.

Suitable base or support materials include films of a wide variety of film-forming synthetic polymers, especially polyester and polyester-polyamide films that can optionally be provided with an adhesive layer. A transparent cover layer, e.g., of polyethylene or polystyrene, can be used in order to prevent contamination of or damage to the photosensitive layer. Other cover layers can be used to improve printing quality.

Flexographic printing elements containing the photopolymerizable composition of the invention can be processed, exposed, and developed in accordance with the methods described in German Patent 2,215,090.

It was surprising and unexpected that the photopolymerizable composition of the invention would yield printing reliefs having improved flexibility which remained affixed to the printing cylinder during printing without adversely affecting other properties such as photospeed or stability of the printing surface.

The reason this was so surprising is that improved flexibility and adhesion were obtained using hard and rigid block copolymers such as thermoplastic-elastomer polystyrene-polybutadiene-polystyrene or polystyrene-polyisoprene-polystyrene.

It was particularly surprising because reducing the hardness of a printing relief by reducing the concentration of monomers having several ethylenically unsaturated groups typically reduces the photospeed of a relief containing such a composition. This is undesirable. Replacing a certain portion of the monomers having several ethylenically unsaturated groups with monomers having only one such group, increases the flexibility of printing reliefs without adversely affecting other properties. In addition, the resulting printing relief has the requisite degree of hardness, i.e., not below 35 Shore A hardness. This means that the printing surface possesses adequate stability so that uniform printing quality can be obtained. Flexographic printing reliefs having the same degree of hardness were made by lowering the concentration of monomers having several ethylenically unsaturated groups and were compared with reliefs made by using mixtures of mono- and polyethylenically unsaturated monomers as discussed herein, it was found that reliefs made in accordance with the invention exhibited greater flexibility.

It was surprising that flexographic reliefs made from the photopolymerizable composition of the invention also exhibited considerably higher photospeed. It was expected that monoethylenically unsaturated compounds would decrease the photospeed of the reliefs as well as impair other physical properties due to the lower degree of crosslinking.

The advantages of using the compositions of the invention are substantial when compared to other methods. The rigid block copolymers are commercially available. They can be used with the technology of the invention. Printing reliefs are produced having improved flexibility and adhesion by selecting a monomer mixture from the points of view of block/monomer compatibility while taking the solubility parameters and glass transition temperatures of the corresponding homopolymers into consideration. The photopolymerizable printing reliefs produced in accordance with the invention have the same photospeed and hardness as conventional printing reliefs.

Furthermore, the photopolymerizable composition of the invention can be used as an edge-sealing and/or gap-filling material for flexographic printing elements or reliefs. When used as an edge-sealing and/or gap-filling material, the binder and monomer mixture ratio should be in the range from 1:2 to 1:4 respectively. It is also possible to add matting agents. This material can be used to provide a flexible seal for a gap between printing reliefs mounted on printing cylinders. Thus, this prevents penetration of printing ink solvents and prevents detachment of printing reliefs from the cylinder to which they are affixed.

The flexographic printing reliefs produced with the photopolymerizable composition of the invention provide considerable advantages as discussed above.

The following examples illustrate the practice of the invention.

Unless stated otherwise, percentages and parts given in the Examples refer to weight.

The following abbreviations were used for the monomers: C2A for ethyl acrylate, C8A for octyl acrylate, C10A for isodecyl acrylate, C12A for dodecyl acrylate, C14A for tetradecyl acrylate, C2(OC6)A for 2-hexyloxyethyl acrylate, C10MA for isodecyl methacrylate, C4DA for 1,4-butanediol diacrylate, C6DA for 1,6-hexanediol diacrylate, C6DMA for 1,6-hexanediol dimethacrylate, C12DMA for 1,12-dodecanediol dimethacrylate, and TMPTA for trimethylol propane triacrylate and DIPETA for dipentaerythritol monohydroxypentaacrylate.

Example 1

12 Printing elements (1–9, 11–13 in Table 1) with 80% of polystyrene-polyisoprene-polystyrene block copolymer (SIS, MW 200,000, 15% polystyrene) as binder, 10% of monomer mixture, 2% of initiator, 2% of inhibitor, and 6% of polystyrene resin (MW 1000–6000) were produced in accordance with the method described in German Patent 2,215,090, Example 10, and with the initiators and inhibitors given there. A 0.12 mm-thick polyethylene terephthalate support film was used, and the total thickness of the printing elements was 3 mm. The ethylenically unsaturated compounds used and their ratios to one another are shown in Table 1.

Example 2

9 Printing elements with 60% of polystyrene-polybutadiene-polystyrene block copolymer as binder (16–22 in Table 1: SBS, MW 100,000, 30% polystyrene; 14 in Table 1: radial SBS, MW 140,000, 30% polystyrene; 15 in Table 1: radial SBS, MW 160,000, 30% polystyrene; 30% by weight of aromatic mineral oil based on the weight of the polymer), 17% of monomer mixture, 1% of initiator, 2% of inhibitor, and 20% of liquid polybutadiene (MW 3000–6000) were produced as in Example 1. The type and ratios of the monomer mixture are also shown in Table 1.

To determine the photospeed, the printing elements produced according to Examples 1 and 2 were exposed for 15 minutes through a Staufer step wedge (21 steps, density difference 0.15) with a commercial UV lamp, were developed as described in German Patent 2,215,090, Example 10, and the number of completely developed steps was determined.

To measure their hardness and flexibility, the printing elements were exposed full-surface for 15 minutes with a commercial UV lamp and were developed as described above. The hardness was measured as Shore A according to DIN 53 505.

To characterize their flexibility, the exposed and developed printing elements were cut into strips 20 cm long and 10 cm wide, were placed on one edge on their narrow side with 2 cm support width, and the angle of inclination between the imaginary extension of the support face and the secant determined by the support point and the end point of the plate, was measured with a protractor.

As can be seen from Table 1, the printing reliefs of the invention have distinctly better flexibility, with constant photospeed and good hardness, than conventional printing reliefs containing solely monomers having several ethylenically unsaturated groups. It is true that their flexibility can also be improved slightly by reducing the concentration of these monomers, but only combined with a reduction in photospeed and hardness (elements 1 and 2 or 16 and 17, respectively). The sole use of monomers having one ethylenically unsaturated group does not deliver a satisfactory result either (element 3), since in this case the photospeed is too low.

It was therefore not foreseeable that high flexibility with simultaneous adequate photospeed and hardness could be achieved with a sharply reduced content of monomers having several ethylenically unsaturated groups. The results achieved with printing elements 7 and 11 illustrate that too high a content of these monomers, outside the M1/M2 ratio range of the invention of 10:1 to 2:1, yields printing reliefs that are too rigid.

Example 3

Two printing elements produced according to Example 2 were exposed as described in German Patent 3,600,774, developed, provided with corresponding diagonal cuts, and the gap occurring at these diagonal abutting edges was sealed with the photosensitive composition of the invention as described in German Patent 3,600,774. Composition:

30% SBS (MW 120,000, 30% styrene)

50% C10A

10% C6DA

5% initiator (cf. German Patent 2,215,090)

2% inhibitor (cf. German Patent 2,215,090)

3% rice starch.

To characterize the stability of the gap sealed with the photosensitive composition of the invention, the gap was treated with a mixture of 80 vol. % of isopropanol and 20 vol. % of ethyl acetate for 5 minutes in a wiping or rubbing test. The material in the gap area showed the same resistance to the solvent mixture as did the rest of the printing relief.

TABLE 1

| Element/ Relief | Binder | Monomer M1 | Monomer M2 | M1:M2 | Photospeed Steps | Hardness Shore A | Bending Angle Degrees |
|---|---|---|---|---|---|---|---|
| 1 | SIS | — | C6DA | — | 14 | 64 | 8 |
| 2 | SIS | — | ½ C6DA | — | 9 | 48 | 12 |
| 3 | SIS | C10A | — | — | 8 | 39 | 41 |
| 4 | SIS | C10A | C6DA | 3:1 | 14 | 46 | 30 |
| 5 | SIS | C14A | C4DA | 6:1 | 13 | 43 | 36 |
| 6 | SIS | C8A | C12DMA | 8:1 | 13 | 43 | 41 |
| 7 | SIS | C6A | C6DMA | 1:1 | 13 | 49 | 27 |
| 8 | SIS | C10A | C6DA | 4:1 | 12 | 45 | 35 |
| 9 | SIS | C10MA | C6DA | 10:1 | 10 | 40 | 44 |
| 11 | SIS | C10A | C6DMA | 1:6 | 13 | 53 | 11 |
| 12 | SIS | C10A | C6DMA/TMPTA | 4:1:0,5 | 12 | 46 | 32 |
| 13 | SIS | C10A | C6DMA/DIPETA | 5:1:0,1 | 12 | 43 | 35 |
| 14 | rSBS | C10A | C4DA | 4:1 | 14 | 53 | 32 |
| 15 | rSBS (30% oil) | C10A | C6DA | 2:1 | 12 | 46 | 33 |
| 16 | SBS | — | C6DA | — | 13 | 72 | 2 |
| 17 | SBS | — | ½ C6DA | — | 7 | 59 | 13 |
| 18 | SBS | C10A | C6DA | 4:1 | 13 | 54 | 29 |
| 19 | SBS | C2(OC6)A | C6DA | 8:1 | 13 | 48 | 29 |
| 20 | SBS | C8A | C6DMA | 4:1 | 11 | 52 | 33 |
| 21 | SBS | C14A | C6DA | 5:1 | 10 | 49 | 35 |
| 22 | SBS | C12A | C4DA | 3:1 | 12 | 55 | 30 |

What is claimed is:

1. A process for edge-sealing a flexographic printing element or relief comprising sealing the edges of the element or relief with a photopolymerizable composition comprising;

(a) at least one thermoplastic-elastomer block copolymeric binder;

(b) at least two addition-polymerizable monomers having terminal ethylenically unsaturated groups wherein (i) at least one of the addition-polymerizable monomers has one acrylate or methacrylate group, said monomer forms a homopolymer having a solubility parameter in the range between 7.6 and 9.6 and a glass transition temperature below 0° C.;

(ii) at least one of the addition-polymerizable monomers has more than one acrylate or methacrylate group, said monomer forms a homopolymer having a solubility parameter in the range between 9.6 and 12; and (iii) the ratio of (i) to (ii) is in the range from 10:1 to 3:1; and (c) a photoinitiator or photoinitiating system.

2. A process for filling gaps between the edges of a flexographic printing element or relief comprising filling the gaps in the element or relief with a photopolymerizable composition comprising;

(a) at least one thermoplastic-elastomer block copolymeric binder;

(b) at least two addition-polymerizable monomers having terminal ethylenically unsaturated groups wherein (i) at least one of the addition-polymerizable monomers has one acrylate or methacrylate group, said monomer forms a homopolymer having a solubility parameter in the range between 7.6 and 9.6 and a glass transition temperature below 0° C.;

(ii) at least one of the addition-polymerizable monomers has more than one acrylate or methacrylate group said monomer forms a homopolymer having a solubility parameter in the range between 9.6 and 12; and (iii) the ratio of (i) to (ii) is in the range from 10.1 to 3:1; and (c) a photoinitiator or photoinitiating system.

* * * * *